(12) United States Patent
Hulsmann et al.

(10) Patent No.: US 9,583,827 B2
(45) Date of Patent: Feb. 28, 2017

(54) MILLIMETER-WAVE RADAR

(71) Applicant: Fraunhofer-Gesellschaft zur Forderung der angewandten Forschung e.V., Munich (DE)

(72) Inventors: Axel Hulsmann, Freiburg (DE); Harald Von Rosenberg, Konigsfeld (DE); Karl-Friedrich Becker, Berlin (DE)

(73) Assignee: FRAUNHOFER-GESELLSCHAFT ZUR FORDERUNG DER ANGEWANDTEN FORSCHUNG E.V., Munich (DE)

( * ) Notice: Subject to any disclaimer, the term of this patent is extended or adjusted under 35 U.S.C. 154(b) by 1 day.

(21) Appl. No.: 14/375,280

(22) PCT Filed: Dec. 20, 2012

(86) PCT No.: PCT/EP2012/076409
§ 371 (c)(1),
(2) Date: Jul. 29, 2014

(87) PCT Pub. No.: WO2013/113454
PCT Pub. Date: Aug. 8, 2013

(65) Prior Publication Data
US 2015/0009081 A1 Jan. 8, 2015

(30) Foreign Application Priority Data

Jan. 31, 2012 (DE) .......... 10 2012 201 367

(51) Int. Cl.
*H01Q 19/06* (2006.01)
*H01Q 1/52* (2006.01)
(Continued)

(52) U.S. Cl.
CPC ............ *H01Q 1/526* (2013.01); *G01S 7/03* (2013.01); *H01Q 19/062* (2013.01);
(Continued)

(58) Field of Classification Search
CPC .... H01Q 1/526; H01Q 19/062; H05K 1/0243; H05K 2201/0141
(Continued)

(56) References Cited

U.S. PATENT DOCUMENTS 5,867,120 A * 2/1999 Ishikawa ............ H01Q 1/3233
342/175
5,955,752 A * 9/1999 Fukaya ................... G01S 7/032
257/275
(Continued)

FOREIGN PATENT DOCUMENTS

| CN | 101014224 | 8/2007 |
|----|-----------|--------|
| CN | 101426333 | 5/2009 |

(Continued)

OTHER PUBLICATIONS

J. Laskar et al., FR-4 and CMOS: Enabling Technologies for Consumer vol. Millimeterwave Applications:, IEEE International Electronic Devices Meeting, IEDM 2007, Dec. 10, 2007, pp. 981-984.
(Continued)

*Primary Examiner* — Dameon E Levi
*Assistant Examiner* — Hasan Islam
(74) *Attorney, Agent, or Firm* — Volpe and Koenig, P.C.

(57) ABSTRACT

A millimeter-wave radar device including at least one millimeter-wave circuit and at least one antenna, wherein the millimeter-wave radar device is designed as a module having a multilayered multipolymer circuit board having at least a first layer composed of a polymer material having low dispersion of the dielectric constant, a second layer com-
(Continued)

posed of a high-strength polymer material, which stabilizes the multipolymer circuit board, and a metallization layer, which is arranged between the first layer and the second layer and serves for shielding and for signal carrying, and the multipolymer circuit board carries the at least one millimeter-wave circuit and the at least one antenna.

13 Claims, 3 Drawing Sheets

(51) Int. Cl.
| | | |
|---|---|---|
| G01S 7/03 | (2006.01) | |
| H01Q 21/00 | (2006.01) | |
| H05K 1/02 | (2006.01) | |
| H05K 1/03 | (2006.01) | |
| H05K 3/46 | (2006.01) | |

(52) U.S. Cl.
CPC ........... *H01Q 21/00* (2013.01); *H05K 1/0218* (2013.01); *H05K 1/0243* (2013.01); *H05K 1/036* (2013.01); *H05K 3/4626* (2013.01); *H05K 2201/0141* (2013.01); *H05K 2201/10098* (2013.01)

(58) Field of Classification Search
USPC .................................................. 343/841, 853
See application file for complete search history.

(56) References Cited

U.S. PATENT DOCUMENTS 7,764,236 B2 *  7/2010  Hill ........................ H01Q 1/243
                                                        343/702
8,022,861 B2 *  9/2011  Margomenos .......... G01S 7/032
                                                        342/175
8,278,749 B2   10/2012  Lachner et al.
2006/0097906 A1   5/2006  Heide
2006/0250308 A1  11/2006  Pinel et al.
2007/0026567 A1 *  2/2007  Beer ...................... G01S 7/032
                                                        438/106
2007/0235214 A1  10/2007  Hall et al.
2009/0251356 A1  10/2009  Margomenos
2010/0090902 A1 *  4/2010  Thompson ............... H01Q 1/40
                                                        343/700 MS
2012/0119969 A1 *  5/2012  MacDonald .......... H01L 23/552
                                                        343/841
2013/0082896 A1 *  4/2013  Renilson ................ H01Q 15/16
                                                        343/872

FOREIGN PATENT DOCUMENTS

| DE | 10300955    | 7/2004 |
| DE | 102010001407 | 9/2010 |
| WO | 2005029634  | 3/2005 |

OTHER PUBLICATIONS

Han Lim Lee et al., "24 GHz Balanced Doppler Radar Front-End with Tx Leakage Canceller for Antenna Impedance Variation and Mutual Coupling", IEEE Transactions on Antennas and Propagation, vol. 59, No. 12, Dec. 1, 2011, pp. 4497-4504.
Rogers Corporation Advanced Circuit Materials, Data Sheet, 1.6202; RT/duroid® 6202 High Frequency Laminates, Publication #92-116, revised Jul. 2010.

* cited by examiner

MILLIMETER-WAVE RADAR

BACKGROUND

The present invention relates to a microwave radar device.

Radar devices are known in prior art, which operate for radar applications in the frequency range from approx. 30 MHz to 300 GHz, with the presently used frequencies ranging from 1 GHz to 100 GHz. Unlike optic measuring systems, the touchless radar measurement yields reliable distances and relative speeds even in difficult environments.

There are various approaches for realizing radar devices, with the most common ones being the pulse radar and the frequency-modulated continuous wave radar (FMCW-radar). The distance and speed of the target can be determined from the extended measuring and the Doppler shift of the receiver signal reflected by the target using signal processing. In the frequency range above 80 GHz the waveguide technology, using modules of the split-block technology, horn antenna, and a separate signal processing unit, is considered prior art, which presently is used primarily in military systems.

W-band radar provides a wide range of applications. The W-band is in the range of millimeter-waves with frequencies from 75 to 110 GHz. The W-band is the best suitable frequency band when small wavelengths are required, for example measuring 3 mm, and thus high spatial resolution and the detection of small objects via radar as well as additionally a low HF-capacity and the detection over long distances. At 94 GHz, thus within the W-band, the atmosphere exhibits a local damping minimum, so that aerosols, such as dust, smoke, steam, and fog can be penetrated very well in the W-band.

Today the wide use of W-band radar applications is still limited by the very high costs and the voluminous design.

SUMMARY

Accordingly the objective of the present invention is to provide a millimeter-wave radar device, which can be realized in a space-saving and cost-effective fashion.

This objective is attained in a millimeter-wave radar device according to the invention. Preferred embodiments of the radar device according to the invention are disclosed below. The wording of all claims is explicitly incorporated here in the description by way of reference.

According to the invention a millimeter-wave radar device is provided with at least one millimeter-wave circuit and at least one antenna, with the millimeter-wave radar device being embodied as a module comprising a multilayered multipolymer circuit board, which has at least one first layer comprising a polymer material with low dielectric loss factor, at least a second layer comprising a polymer material with high strength, which stabilizes the multipolymer circuit board, and a metallization layer, which is arranged between the first and the second layer and serves for shielding and for signal carrying, and with the multipolymer circuit board carrying at least one millimeter-wave circuit and at least one antenna. By the configuration according to the invention the weight and volume of radar systems designed in this fashion can be reduced and it is possible to open new fields of application, which previously could not be realized. Simultaneously the production costs can be reduced significantly.

The low dielectric loss factor leads to low damping, particularly in reference to the second layer comprising a polymer material.

The high strength of the second layer shall be understood within the scope of the present invention as a higher strength in reference to the first layer such that the second layer shows higher stability and thus higher supportive effects for the radar device, compared to the first layer. Accordingly, at least the second layer shows preferably a tensile and pressure strength of at least 280 MPa.

According to a preferred embodiment the millimeter-wave circuit and the antenna are embedded in the first layer.

According to another preferred embodiment the first layer additionally carries a processing electronic and/or a signal generating electronic.

According to a further preferred embodiment the thickness of the first layer and the thickness of the millimeter-wave circuit are essentially identical and/or show particularly a difference in thickness of less than 10%.

Preferably the antenna is embodied as an edge-emitting antenna of high band width, particularly of the Vivaldi-type.

According to another preferred embodiment the antenna is embedded as a diaphragm in the first layer.

It is particularly preferred for the millimeter-wave radar device to include at least one dielectric lens.

Furthermore it is beneficial for at least one millimeter-wave circuit to represent a monolithically integrated millimeter-wave circuit without a housing.

Preferably the first layer comprises liquid-crystal polymers (LCP).

According to another preferred embodiment the second layer comprises FR4.

According to another preferred embodiment the millimeter-wave radar device is designed for W-band radar applications at a frequency range from 75 to 100 GHz.

Preferably the millimeter-wave circuit is embedded in the first layer with an air gap above it.

According to another preferred embodiment the polymer material of low dispersion is characterized in (($\in_r$(DC)−$\in_r$ (500 GHz)<0.01 and/or dielectricity of $\in_r$<3.

Low damping is preferably achieved such that within the scope of the present invention the polymer material of the first layer shows a dielectric loss factor (tan ($\delta$)<0.005 at 100 GHz), which is considered low.

Preferably at least one antenna is arranged in a single configuration or a plurality of antennas in an array configuration.

By the novel and cost-effective circuit board technology in polymer-embedding technology of monolithically integrated millimeter-wave circuits (MMICs) without housings considerable cost savings can be achieved in the design and joining technology (AVT). Here, circuit board materials with low dielectric loss factor but low strength (e.g., LCP, Rogers, etc.) are combined with materials of high strength (e.g., FR4) and separated from each other by metallization layers serving for shielding or signal carrying. The thickness of the polymer material with the low dielectric loss factor and the thickness of the millimeter-wave circuits are here adjusted to each other in order to realize the millimeter-wave signal transfers with extremely low insertion loss. The thickness of the polymer material preferably deviates by less than 20%, particularly preferred by less than 10% from the thickness of the millimeter-wave circuit (i.e. from the thickness of a chip including the millimeter-wave circuit). This results in the advantage that a transfer between the chip including the millimeter-wave circuit and the polymer material with low damping shows no or only a minor offset in height which typically must be bridged by a bonding wire (e.g., a so-called wedge bond) connecting the chip and the polymer material.

By combining various polymer materials of the multilayer circuit board it is possible to combine signal processing of the receiver signal, showing an A/D converter, fast Fourier transformation (FFT), and signal analysis, but also the generation of transmission signals, showing a direct digital frequency synthesizer (DDS), with the high-frequency design. Here, signal processing and evaluation occur preferably via electronic components arranged on the multilayer circuit board. This way, not only signal processing is possible in the sense of signal conditioning but additionally already also the evaluation, for example object detection) is already performed by the components of the multipolymer circuit board and thus no external electronic components are necessary for performing these tasks.

The scope of the invention includes embodying the second layer as a multilayered system and/or to arrange additional layers on the second layer at the side facing away from the first layer. In particular, it is advantageous to embody a DC-wiring of the components of the millimeter-wave radar device within the above-mentioned layer system and/or between the second layer and a third layer and perhaps additional layers.

The metallization layer preferably shows a thickness ranging from 5 μm to 20 μm, particularly preferred amounting to approximately 13 μm. The metallization layer is preferably made from copper. The embodiment of the metallization layer from other materials and particularly as an electroplated layer is also within the scope of the invention.

According to the invention here a radar device is provided which preferably is embodied as a compact module, which practically includes all functional elements in an integrated fashion.

BRIEF DESCRIPTION OF THE DRAWINGS

In the following, additional preferred features and embodiments of the invention are described based on exemplary embodiments with reference to the attached figures. Shown are.

DETAILED DESCRIPTION OF THE PREFERRED EMBODIMENTS

Figure 1:
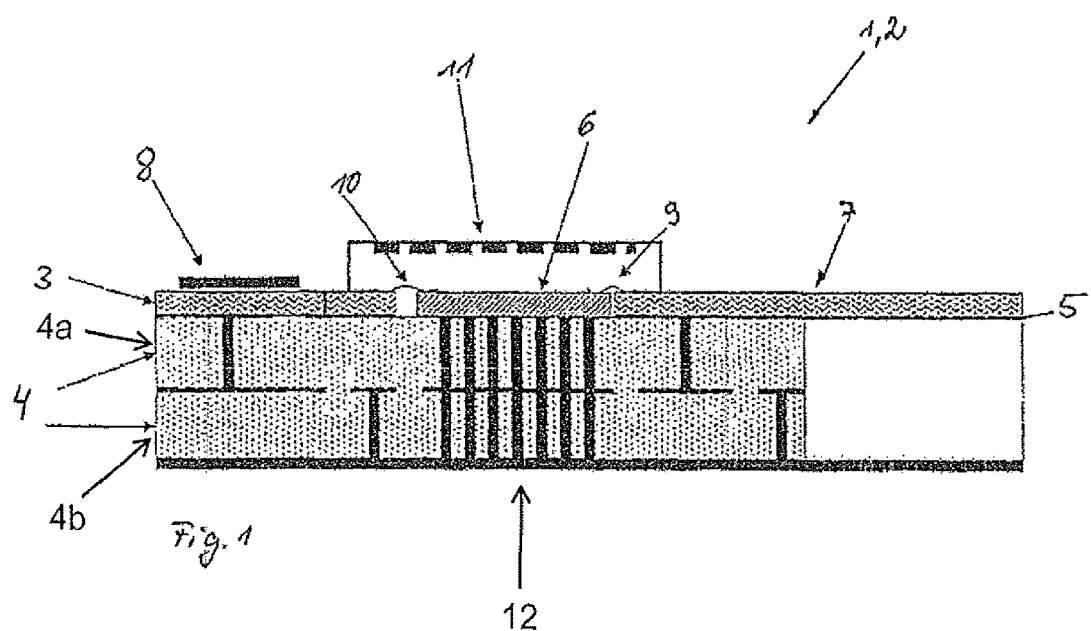
FIG. 1 a cross-section through a millimeter-wave radar device according to one embodiment of the invention.

FIG. 1 shows a cross-section through a millimeter-wave radar device 1 according to one embodiment of the invention with a multilayered multipolymer circuit board 2. The millimeter-wave radar device 1 is designed for W-band radar applications in a frequency range from 75 to 100 GHz. The multipolymer circuit board 2 is embodied in a modular fashion and comprises a first layer 3 made from a polymer material with low dispersion of the dielectric constant, here LCP, and a second layer 4 made from a polymer material with high strength, here FR4, which stabilizes the multipolymer circuit board 2. Furthermore, a metallization layer 5 is arranged between the first layer 3 and the second layer 4, which serves for shielding and for signal carrying. In the embodiment shown here, the first layer 3 and the second layer 4 each have a thickness of 50 μm. A monolithically integrated millimeter-wave circuit (MMIC) 6, without a housing, comprising a compound semiconductor, here GaAs, in the first layer 3 via polymer embedding technology.

In one embodiment the millimeter-wave circuit 6 also has a thickness of 50 μm. Furthermore, an antenna 7 is embedded in the first layer 3 as a thin diaphragm, which here is embodied as an edge-emitting broadband Vivaldi antenna, which serves for transmitting and receiving radar signals. Additionally, a processing electronic, not shown in greater detail, and a signal generation electronic are provided on the multipolymer circuit board 2. Here, the processing electronic is embodied in a programmable fashion, i.e. such that by modular software/firmware an evaluation can occur for various applications and/or fields of applications.

Figure 2:
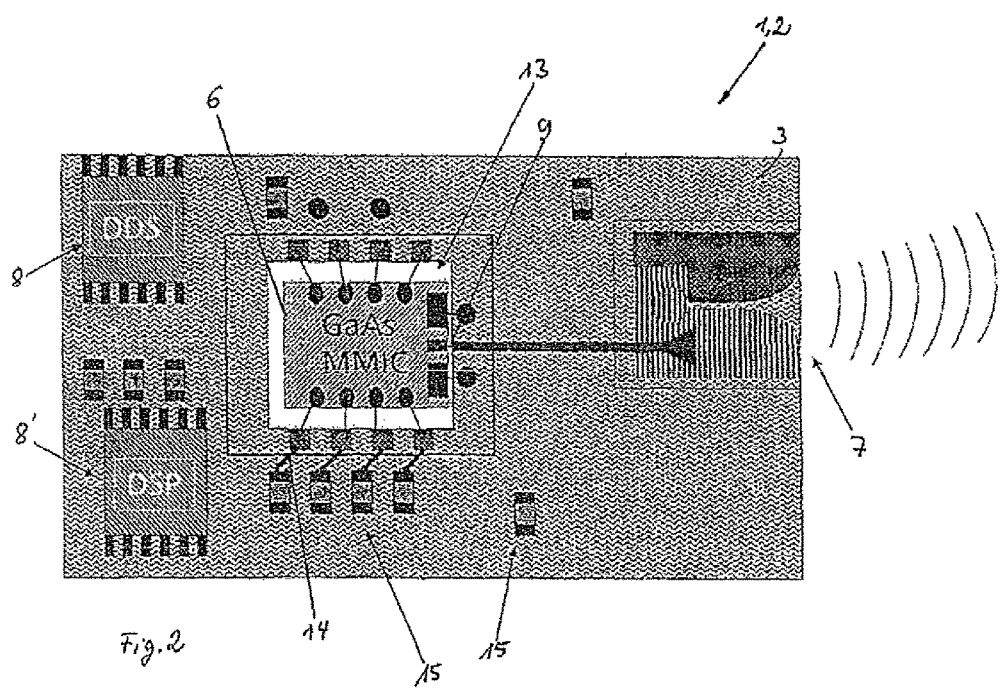
FIG. 2 a top view of the millimeter-wave radar device shown in FIG. 1.

Furthermore, Si-chips 8 are arranged on the first layer 3, which are described in greater detail in the context with FIG. 2. The millimeter-wave circuit 6 is connected via a short flat HF-connection 9 to the antenna 7. Furthermore, the millimeter-wave circuit 6 is connected via a DC-connection 10 to a direct current—energy source (not shown here).

The millimeter-wave circuit 6 is shielded by a HF-shield 11, which is arranged above the millimeter-wave circuit 6 on the first layer 3. A plurality of metallic thermal through connections 12 is provided through the first layer 3, through the second layer, as well as through both layers, serving to dissipate heat.

In this exemplary embodiment, the second layer 4 is formed by two layers 4a and 4b laying over top of each other and thus represents a laminar system. Here, in a simple and cost-effective fashion a DC-wiring of the electronic components of the millimeter-wave radar device 1 can be implemented particularly between the layers 4a and 4b. The partial layers 4a and 4b each show a thickness of approximately 254 μm. The first layer 3 shows a thickness of approximately 50 μm. The metallization layer 5 is here connected to ground with regards to the electric potential and shows a thickness of approximately 13 μm. The metallization layer 5 is made from copper.

FIG. 2 represents a top view of the millimeter-wave radar device 1 shown in FIG. 1. As discernible here, the millimeter wave circuit 6 is arranged in a recess 13 in the first layer 3 and connected via a plurality of electric connections 14 to SMD (surface mounted devices) components 15. In the embodiment shown here, a first Si-chip 8 provided on the first layer 3 is a DDS to generate the frequency chirp signal and a second Si-Chip 8' provided on the first layer 3 is here a digital signal processor (DSP). The digital signal processor is embodied for signal processing and evaluation.

Figure 3:
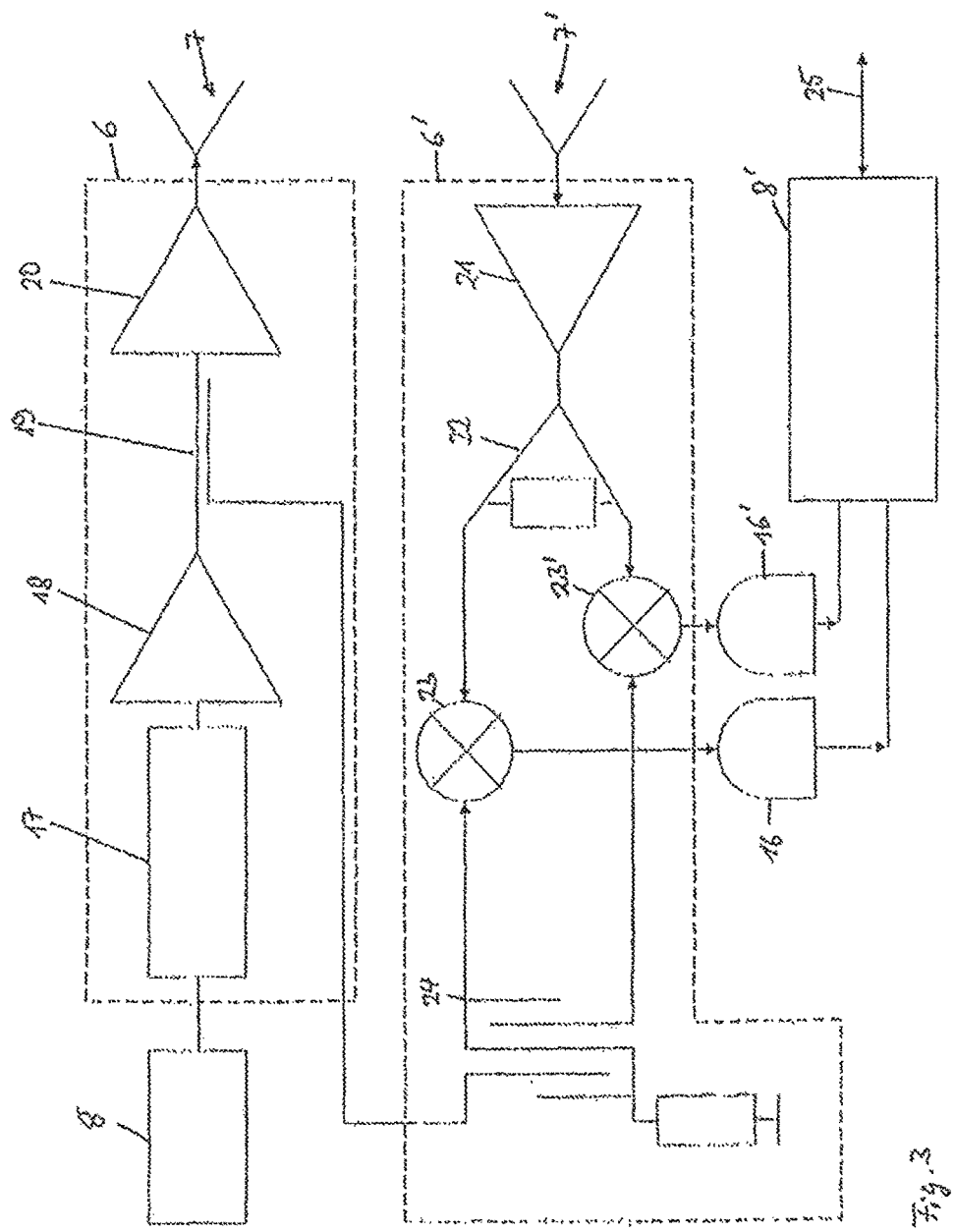
FIG. 3 a diagram of an embodiment as a FMCW-radar according to one embodiment of the invention.

FIG. 3 is an illustration of a diagram of a realization in principle as FMCW-radar according to an embodiment of the invention, which comprises separate transceiver millimeter-wave circuits 6, 6', a DDS 8 for generating a frequency chirp signal, two analog-digital converters 16, 16', and a digital signal processor 8'. The signal processor 8' is connected to an interface 25, for example a WLAN, LAN, CAN, or USB interface. The components of the transmitter millimeter-wave circuit 6 include a frequency multiplier 17 in the frequency range above 80 GHz, an amplifier 18 of medium capacity, a coupler 19 for uncoupling the transmission signals, and a power amplifier 20. The components of the receiver millimeter-wave circuit 6' are a low-noise input amplifier 21, a power splitter (Wilkinson splitter) 22, and two mixers 23, 23', which are respectively controlled via a 90° phase-shifted transmission signal from the Lange-coupler 24. In order to improve the directional characteristic of the edge-emitting antennas 7, 7' dielectric lenses (not shown) are used, additionally provided in the radiation path. This way the radiation characteristic can be adjusted to the respective applications. Additional cost reductions can be achieved by the modular design possible here.

The novel design and joining technology (AVT) described here allows a HF-suitable embedding technology for radar devices with frequencies above 80 GHz for the core objectives "embedding integrated circuits for millimeter-waves with and without air gap" and "realizing free-standing antennas in individual and/or array configurations".

The millimeter wave radar device 1 according to the invention provides the conditions for producing compact radar sub-systems, which can be used in various fashions. Potential applications are found in the airspace industry (helicopter landing aids, ground distance radar, imaging SAR), in security technology (monitoring protected zones, e.g., in container ports, stand-off detection, personnel control, remote sensing), in industrial sensor technology (measuring fill levels of powders and granulates, food, steel production, chemical industry), in traffic monitoring (measuring traffic flow, automotive applications, risk reduction), in novel technical applications in medicine (mapping the environment for prostheses), in security technology (object security), in medical technology (intelligent prostheses), and in traffic technology (detecting obstacles).

LIST OF REFERENCE CHARACTERS

1 Millimeter-wave radar device
2 Multipolymer circuit board
3 First layer
4 Second layer
5 Metallization layer
6, 6' Millimeter-wave circuit
7, 7' Antenna
8, 8' Si-chip
9 HF-connection
10 DC-connection
11 HF-shielding
12 Through contacting
13 Recess
14 Electric connections
15 SMD components
16, 16' A/D converter
17 Frequency multiplier
18 Amplifier
19 Coupler
20 Power amplifier
21 Input amplifier
22 Power splitter
23, 23' Mixer
24 Lange-coupler
25 Interface

The invention claimed is:

1. A millimeter-wave radar device (1) comprising at least one millimeter-wave circuit (6, 6') and at least one antenna (7, 7') embodied as an edge-emitting antenna of high band width, the millimeter-wave radar device (1) is embodied in a modular form comprising a multilayered multipolymer circuit board (2), which includes at least one first layer (3) made from a polymer material with a low dielectric loss factor and the antenna (7, 7') is embedded in the first layer as a diaphragm, at least one second layer (4) made from a polymer material with higher strength than the at least one first layer and the at least one second layer (4) has a tensile strength of at least 280 MPa, which stabilizes the multipolymer circuit board (2), and a metallization layer (5), which is arranged between the first layer (3) and the second layer (4) and serves for shielding and for signal carrying, and the multipolymer circuit board (2) carries the at least one millimeter-wave circuit (6, 6') and the at least one antenna (7, 7').

2. A millimeter-wave radar device (1) according to claim 1, wherein the millimeter-wave circuit (6, 6') and the antenna (7, 7') are embedded in the first layer (3).

3. A millimeter-wave radar device (1) according to claim 2, wherein the first layer (3) additionally carries at least one of processing electronics or signal generation electronics.

4. A millimeter-wave radar device (1) according to claim 1, wherein a thickness of the first layer (3) and a thickness of the millimeter-wave circuit (6, 6') have less than a 10% difference in thickness.

5. A millimeter-wave radar device (1) according to claim 1, wherein the millimeter wave radar device (1) includes at least one dielectric lens.

6. A millimeter-wave radar device (1) according to claim 1, wherein at least one millimeter-wave circuit (6, 6') is a monolithically integrated millimeter-wave circuit (6, 6') without a housing.

7. A millimeter-wave radar device (1) according to claim 1, wherein the first layer (3) comprises liquid-crystal polymers (LCP).

8. A millimeter-wave radar device (1) according to claim 1, wherein the second layer (4) comprises FR4.

9. A millimeter-wave radar device (1) according to claim 1, wherein the millimeter wave radar device (1) is designed for W-band radar applications in a frequency range from 75 to 110 GHz.

10. A millimeter-wave radar device (1) according to claim 1, wherein the millimeter-wave circuit (6, 6') is embedded in the first layer (3) with an air gap located above it.

11. A millimeter-wave radar device (1) according to claim 1, wherein the polymer material of low dispersion meets at least one of $((\in r(DC) - \in r(500 \text{ GHz}) < 0.01$ or dielectricity of $\in r < 3$.

12. A millimeter-wave radar device (1) according to claim 1, wherein the at least one antenna (7, 7') is arranged in a single configuration or a plurality of the antennas (7, 7') are arranged in an array configuration.

13. A millimeter-wave radar device (1) according to claim 1, wherein the polymer material has a dielectric loss factor $(\tan (\delta) < 0.005$ at 100 GHz).

* * * * *